US012642029B2

(12) United States Patent
Takahata et al.

(10) Patent No.: US 12,642,029 B2
(45) Date of Patent: May 26, 2026

(54) MANUFACTURING METHOD OF SEMICONDUCTOR DEVICE

(71) Applicants: DENSO CORPORATION, Kariya-city (JP); TOYOTA JIDOSHA KABUSHIKI KAISHA, Toyota (JP); MIRISE Technologies Corporation, Nisshin (JP)

(72) Inventors: Hiroyuki Takahata, Nisshin (JP); Yuji Nagumo, Nisshin (JP); Masashi Uecha, Nisshin (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 470 days.

(21) Appl. No.: 18/156,682

(22) Filed: Jan. 19, 2023

(65) Prior Publication Data

US 2023/0268185 A1 Aug. 24, 2023

(30) Foreign Application Priority Data

Feb. 22, 2022 (JP) ................................. 2022-025770

(51) Int. Cl.
*H10P 52/00* (2026.01)
*H10P 72/70* (2026.01)

(52) U.S. Cl.
CPC .......... *H10P 52/00* (2026.01); *H10P 72/7402* (2026.01); *H10P 72/7416* (2026.01); *H10P 72/7422* (2026.01)

(58) Field of Classification Search
CPC ............... H01L 21/304; H01L 21/6836; H01L 2221/68327
See application file for complete search history.

(56) References Cited

U.S. PATENT DOCUMENTS

| | | | | |
|---|---|---|---|---|
| 2017/0213756 A1* | 7/2017 | Yoshida | .................. | H01L 21/78 |
| 2018/0233410 A1* | 8/2018 | James | ..................... | H01L 21/78 |
| 2020/0361120 A1* | 11/2020 | Murakami | .............. | H01L 21/78 |

FOREIGN PATENT DOCUMENTS

| | | |
|---|---|---|
| JP | 2013-089622 A | 5/2013 |
| JP | 2014-107339 A | 6/2014 |

(Continued)

OTHER PUBLICATIONS

Machine translation of JP 2015-046555 A (Year: 2015).*

*Primary Examiner* — Brian Turner
(74) *Attorney, Agent, or Firm* — Posz Law Group, PLC

(57) ABSTRACT

A manufacturing method of a semiconductor device, includes: preparing a wafer having a first surface on which a plurality of semiconductor elements is formed and to which a support plate is attached through an adhesive; grinding a second surface of the wafer opposite to the first surface in a state where the support plate is attached to the first surface of the wafer; forming a vertical crack inside the wafer and along a boundary between the adjacent semiconductor elements by pressing a scribe wheel against the wafer along the boundary; separating the support plate from the wafer while leaving the adhesive on the first surface of the wafer; cleaving the wafer along the boundary by pressing a breaking bar against the wafer over the adhesive and along the boundary; and removing the adhesive from at least one of the semiconductor elements divided from the wafer by the cleaving.

11 Claims, 3 Drawing Sheets

(56)  References Cited

FOREIGN PATENT DOCUMENTS

| | | | | |
|---|---|---|---|---|
| JP | 2015046555 A | * | 3/2015 | ......... H01L 21/3043 |
| JP | 2016112714 A | * | 6/2016 | |
| JP | 2018-170475 A | | 11/2018 | |
| JP | 2021002625 A | * | 1/2021 | |

* cited by examiner

MANUFACTURING METHOD OF SEMICONDUCTOR DEVICE

CROSS REFERENCE TO RELATED APPLICATION

The present application claims the benefit of priority from Japanese Patent Application No. 2022-025770 filed on Feb. 22, 2022. The entire disclosures of the above application are incorporated herein by reference.

TECHNICAL FIELD

The present disclosure relates to a manufacturing method of a semiconductor device.

BACKGROUND

It is known a manufacturing method of a semiconductor device including a process of individually cutting out semiconductor elements from a wafer on which multiple semiconductor elements are formed. For example, a wafer is cut (diced) along a boundary between adjacent semiconductor elements. Also, a method called a scribing and breaking process is known.

SUMMARY

The present disclosure describes a manufacturing method of a semiconductor device, which is capable of reducing damage to a wafer.

BRIEF DESCRIPTION OF THE DRAWINGS

Objects, features and advantages of the present disclosure will become more apparent from the following detailed description made with reference to the accompanying drawings, in which like parts are designated by like reference numbers and in which.

DETAILED DESCRIPTION

Figure 1:
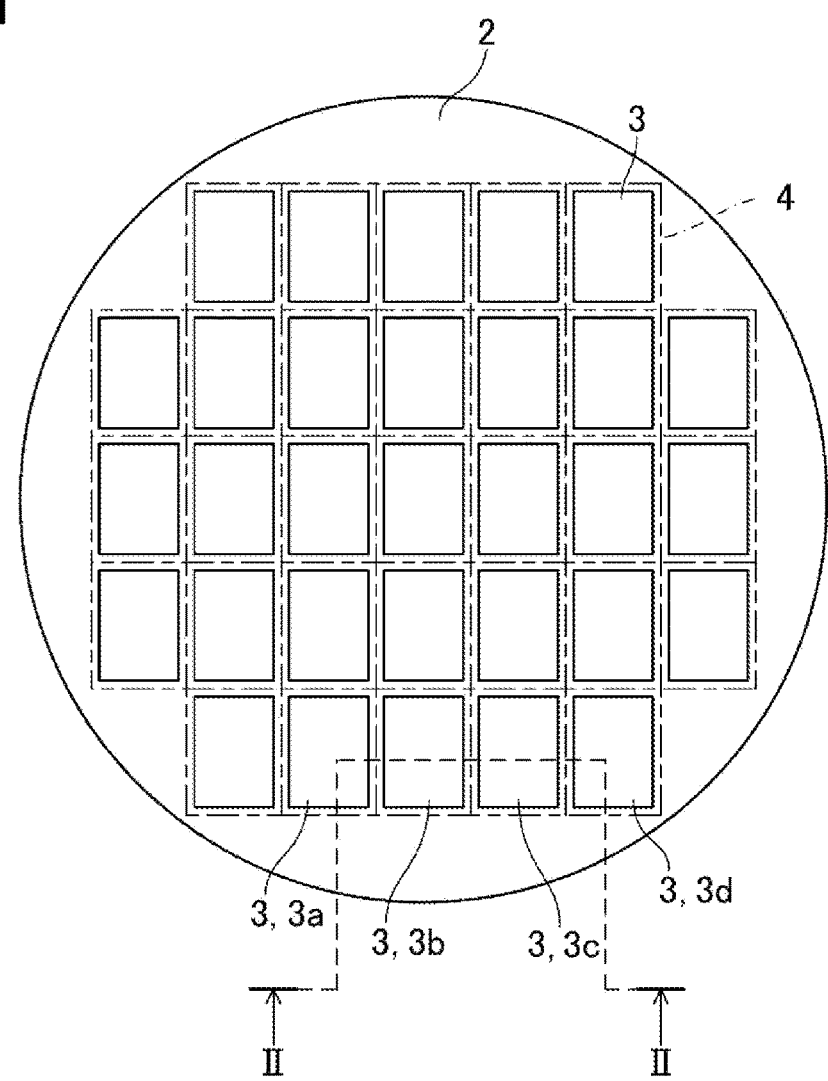
FIG. 1 is a plan view of a wafer.

To begin with, a relevant technology will be described only for understanding the embodiments of the present disclosure.

As a part of manufacturing method of a semiconductor device, a scribing and breaking process is known. In the scribing and breaking process, a scribe wheel, which is a disk with a thin peripheral edge, is first pressed against a wafer along a boundary between adjacent semiconductor elements to generate a crack inside the wafer along the boundary. Since the crack extends in a direction perpendicular to a surface of the wafer, the crack will be referred to as a vertical crack. Next, a breaking bar is pressed along the boundary to cleave the wafer along the boundary. The scribing and breaking process can reduce a width between the adjacent semiconductor elements in the wafer, as compared to that in a case of the conventional dicing process.

In a process of forming semiconductor elements on a wafer, main structures, such as trenches and electrodes, which realize the functions of the semiconductor elements, are formed on a surface layer of a first surface of the wafer, and a second surface of the wafer is ground. Generally, the main structures are formed on the first surface of the wafer, and then the second surface of the wafer is ground. In a process of grinding the second surface of the wafer, an adhesive is applied to the first surface of the wafer and the support plate is attached to the first surface of the wafer through the adhesive. Since the main structures for realizing the functions of the semiconductor elements have been formed on the first surface, the adhesive is applied to the first surface with a relatively large thickness and the wafer is attached to the support plate through the adhesive. Such a thick adhesive layer also serves as a protective layer to protect the main structures on the first surface of the wafer. However, if it is tried to peel off the thick adhesive layer from the wafer after the vertical crack is formed in the wafer, a relatively large stress is likely to be generated inside the wafer due to the stickiness of the adhesive. If the vertical cracks are expanded further, there is a fear that the wafer will be damaged.

According to an aspect of the present disclosure, a manufacturing method of a semiconductor device, includes: preparing a wafer having a first surface on which a plurality of semiconductor elements is formed and to which a support plate is attached through an adhesive is prepared; grinding a second surface of the wafer opposite to the first surface to which the support plate is attached is ground; forming a vertical crack inside the wafer along a boundary between the adjacent semiconductor elements by pressing a scribe wheel against the wafer along the boundary; separating the support plate from the wafer while leaving the adhesive on the first surface of the wafer; cleaving the wafer along the boundary by pressing a breaking bar against the wafer over the adhesive and along the boundary; and removing the adhesive from at least one of the semiconductor elements that has been divided from the wafer by the cleaving.

In such a manufacturing method, the wafer is cleaved by pressing the breaking bar against the wafer over the adhesive without removing the adhesive from the first surface, that is, in the state where the adhesive is left on the first surface. The adhesive is removed after the semiconductor element is divided from the wafer. Therefore, since the wafer has been already cleaved along the vertical crack when the adhesive is removed, it is less likely that the vertical crack will expand further when the adhesive is removed.

As an embodiment of the present disclosure, a manufacturing method of a semiconductor device will be described hereinafter with reference to the drawings.

FIG. 1 is a plan view of a wafer 2 on which multiple semiconductor elements 3 are formed in a grid pattern. In FIG. 1, the semiconductor element 3 is schematically represented by a solid-line rectangle. The reference numeral "3" has been omitted for some solid-line rectangles. For convenience of explanation, a dividing line which is a boundary between adjacent semiconductor elements 3 and which is used when dividing the wafer 2 into individual semiconductor elements 3 later is referred to as a scribe line 4. As an example, the scribe line 4 is not a line actually marked on the wafer 2, but is an imaginary line. Alternatively, the scribe line 4 may be an actual groove or an actual line actually drawn on the wafer 2 so as to be visually recognizable. In FIG. 1, the scribe line 4 is indicated by an alternate long and short dashed line. Each semiconductor element 3 divided out from the wafer 2 corresponds to a semiconductor device. The semiconductor element 3 is an element having a function such as a transistor or a diode.

The material of the wafer 2 may be a semiconductor material such as silicon carbide (SiC) or gallium nitride (GaN), but is preferably a semiconductor material having a crystal plane. The wafer 2 is formed such that the crystal plane is perpendicular to a surface of the wafer 2. The semiconductor elements 3 are formed such that the scribe line 4, which is the boundary between adjacent semiconductor elements 3, coincides with the crystal plane in a plan view of the wafer.

A manufacturing method of a semiconductor device corresponding to the semiconductor element 3 will be described with reference to FIG. 2 to FIG. 8. Note that FIG. 2 to FIG. 8 each illustrate a cross section taken along line II-II of FIG. 1. For convenience of explanation, the semiconductor elements laid on the line II-II in FIG. 1 are referred to as semiconductor elements 3a, 3b, 3c and 3d from the left.

In the embodiment, the manufacturing method includes a grinding process, a scribing process, a support plate separating process, a breaking process, and a removing process.
<Grinding Process>

The grinding process will be described with reference to FIG. 2 and FIG. 3. The wafer 2 has a first surface 2a and a second surface 2b opposite to the first surface 2a. Main structures 6 of the semiconductor elements 3a and 3b, such as gates and channels, are formed on a surface layer of the wafer 2 on the first surface 2a side. The wafer 2 is thinned later. That is, in FIG. 2, the wafer 2 is shown thicker than that in FIG. 3 in order to indicate that the wafer 2 has not yet been thinned.

Figure 2:
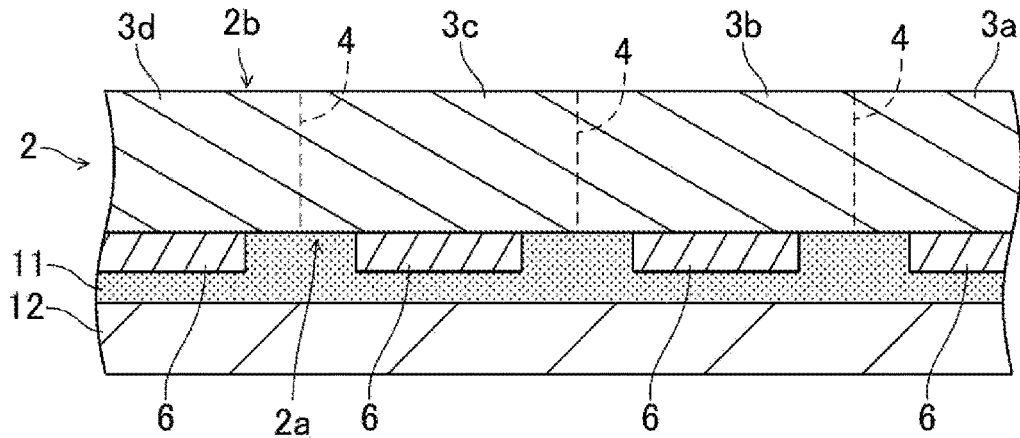
FIG. 2 is a diagram illustrating a part of a grinding process.
Figure 3:
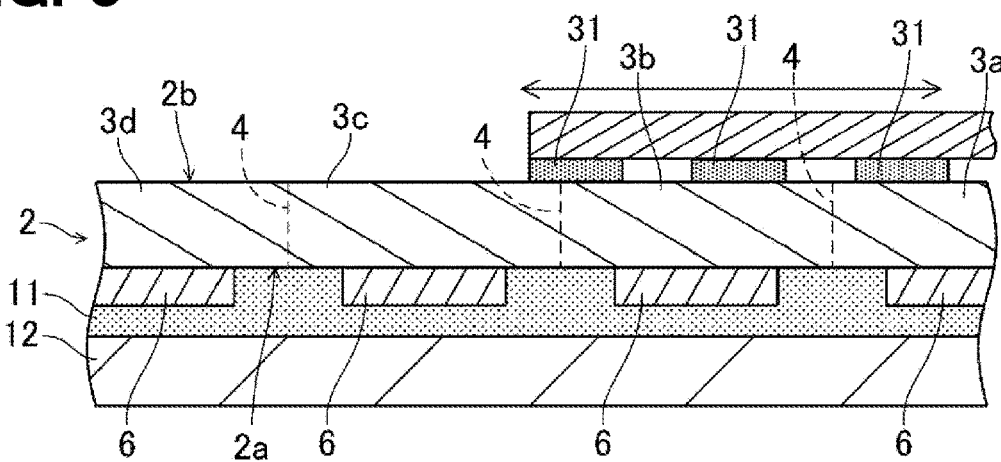
FIG. 3 is a diagram illustrating another part of the grinding process subsequent to the process illustrated in FIG. 3.
Figure 4:
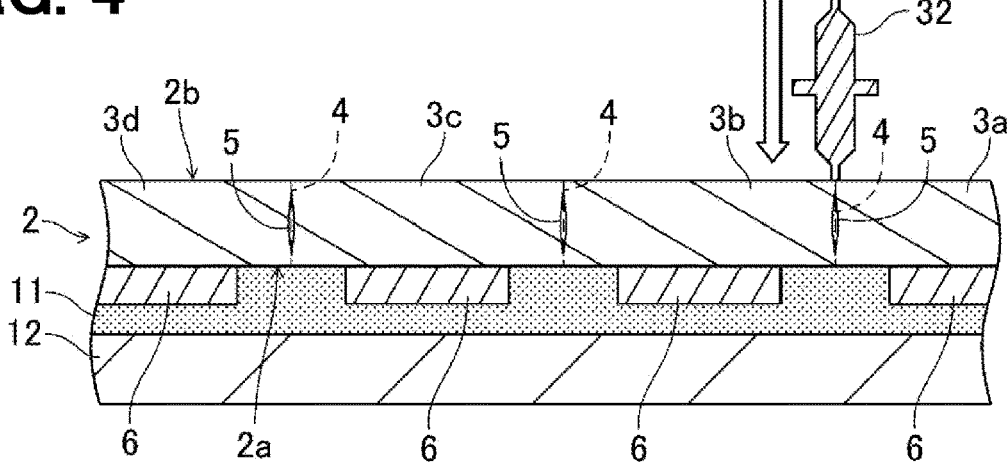
FIG. 4 is a diagram illustrating a scribing process.

In FIGS. 2 and 3 (also FIG. 4, which will be described later), the wafer 2 is shown with the first surface 2a facing downward. The scribe line 4 is shown inside the wafer 2 by a dashed line. In FIG. 2, a part of the wafer 2 on the left side of a left scribe line 4 corresponds to the semiconductor element 3d, a part of the wafer 2 on the left side of a central scribe line 4 corresponds to the semiconductor element 3c. Also, a part of the wafer 2 on the right side of the central scribe line 4 corresponds to the semiconductor element 3b, and a part of the wafer 2 on the right side of the right scribe line 4 corresponds to the semiconductor element 3a. The semiconductor elements 3a to 3d will be collectively referred to as "semiconductor element 3" when they are explained without distinction.

Note that illustration and description of the specific internal structure of the semiconductor element 3 are omitted. In order to facilitate understanding in the drawings, the main structure 6 of the semiconductor element 3, which includes an essential part for realizing the function of the semiconductor element, is shown with a hatching different from a hatching of a rest part of the wafer 2. For example, the main structure 6 includes a channel, a gate electrode, and the like formed in the semiconductor element 3. The main structure 6 is formed at the surface layer of the wafer 2 on the first surface 2a side. On the second surface 2b side, either nothing or a simple structure such as an electrode is formed.

In the grinding process, the first surface 2a of the wafer 2 is attached to a support plate 12 through an adhesive 11, and the second surface 2b of the wafer 2 is ground by a grinding wheel 31, as shown in FIG. 3. The wafer 2 is thinned by grinding. In FIG. 3, the wafer 2 is thus thinner than that shown in FIG. 2.

The adhesive 11 is, for example, a silicon-based adhesive. The adhesive 11 has a function of adhering the wafer 2 to the support plate 12 as well as a function of protecting the main structure 6 formed on the first surface 2a side of the wafer 2. Therefore, the adhesive 11 is applied to have a relatively large thickness. Although not specifically illustrated, the first surface 2a side of the wafer 2 is uneven, that is, the wafer 2 has projections or recesses on the first surface 2a side due to the main structures 6 formed thereon. The adhesive 11 can enter into the recesses, and thus can closely adhere to the first surface 2a. Further, the adhesive 11 has a property that a surface layer thereof hardens and loses its stickiness when irradiated with ultraviolet rays.
<Scribing Process>

Following the grinding process, a scribing process is performed. The scribing process will be described with reference to FIG. 4. The first surface 2a of the wafer 2 has been attached to the support plate 12 through the adhesive 11. In the scribing process, the wafer 2 is used in a state of being attached to the support plate 12. In the scribing process, a scribe wheel 32 is pressed against the wafer 2 from the second surface 2b side and along the scribe line 4, that is, along the boundary between the adjacent semiconductor elements 3 to form a vertical crack 5 inside the wafer 2 along the scribe line 4.

The wafer 2 is fixed to the support plate 12 with the adhesive 11 interposed therebetween. Therefore, even if the scribe wheel 32 is moved along the scribe line 4, the wafer 2 does not move. Further, even if the scribe wheel 32 is strongly pressed against the wafer 2, the adhesive 11 protects the main structures 6.

The scribe wheel 32 is a disc-shaped component and is pivotally supported by a support device (not shown). The scribe wheel 32 is moved along the scribe line 4 while being pressed against the wafer 2. During the movement, the scribe wheel 32 rolls over the wafer 2 without slipping like a tire rolling on a road surface. Although the scribe wheel 32 has a sharp peripheral edge, the scribe wheel 32 does not cut the wafer 2 and is only pressed against the wafer 2 from the second surface 2b side. As described above, the scribe line 4 extends along the crystal plane of the wafer 2. Thus, when the scribe wheel 32 is strongly pressed against the wafer 2, a vertical crack 5 is generated inside the wafer 2 along the scribe line 4. The "vertical crack" means a crack extending perpendicularly to the surface of the wafer 2. In other words, the vertical crack 5 extends along the crystal plane of the wafer 2.
<Support Plate Separating Process>

Figure 5:
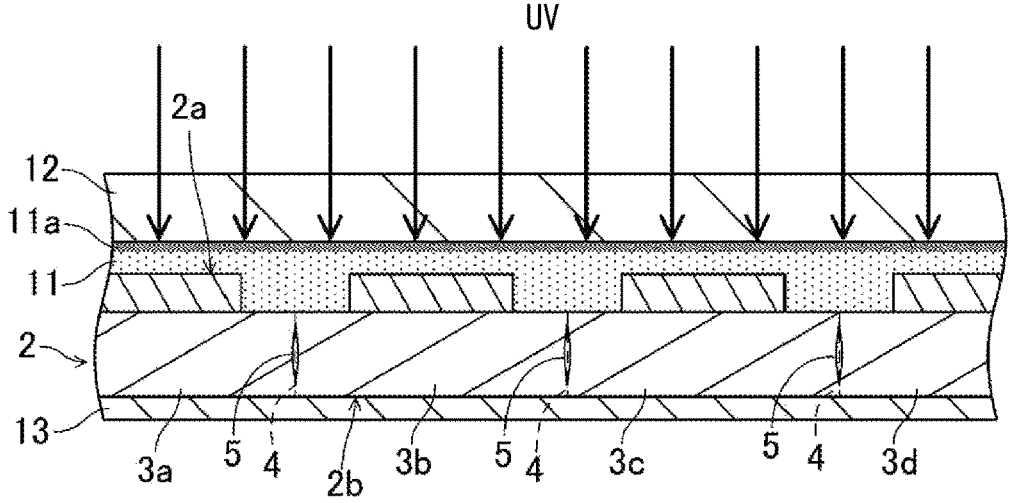
FIG. 5 is a diagram illustrating a part of a support plate separating process.

Following the scribing process, the support plate separating process is performed. The support plate separating process will be described with reference to FIGS. 5 and 6. It should be noted that, in FIG. 5 and subsequent drawings, the wafer 2 is illustrated with the first surface 2a facing up. Before separating the support plate 12, a dicing tape 13 is attached to the second surface 2b of the wafer 2, as shown in FIG. 5. Further, the wafer 2 is fixed to a dicing ring (not shown).

Figures 6, 7, 8:
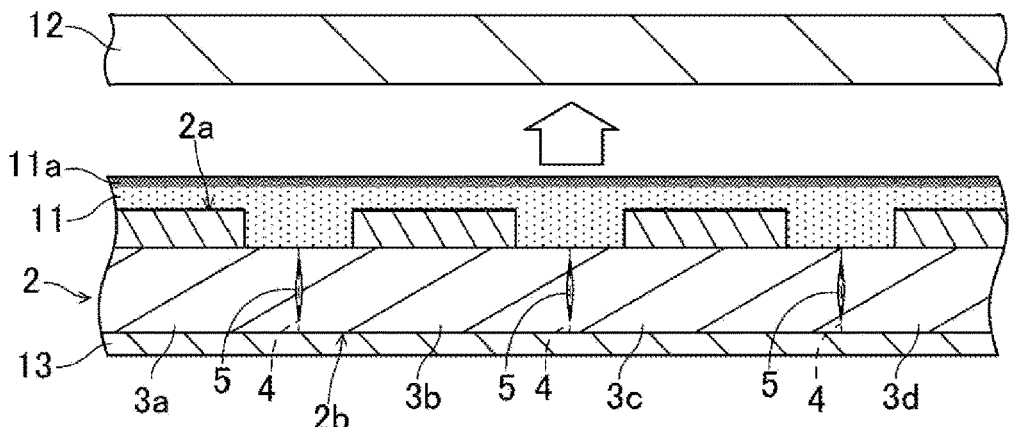
FIG. 6 is a diagram illustrating another part of the support plate separating process subsequent to the process illustrated in FIG. 5.
FIG. 7 is a diagram illustrating a breaking process.
FIG. 8 is a diagram illustrating a removing process.

In the support plate separating process, the support plate 12 is separated from the wafer 2 while the adhesive 11 is kept on the wafer 2. As described above, when the adhesive 11 is irradiated with the ultraviolet rays, the surface layer 11a of the adhesive 11 is cured, and the surface of the surface layer 11a loses its adhesive force. Also, the support plate 12 is made of transparent glass. As shown by solid arrows in FIG. 5, the adhesive 11 is irradiated with the ultraviolet rays through the transparent support plate 12. As a result, the surface layer 11a of the adhesive 11 hardens and the surface of the surface layer 11a loses its adhesive property. Therefore, the support plate 12 is easily removed from the wafer 2, as shown in FIG. 6.

As the adhesive 11, a thermosetting adhesive may be used. In such a case, the support plate 12 may not be transparent. The support plate 12 may be separated from the adhesive 11 by heating the surface layer 11a of the adhesive 11 to lose its adhesive property.

<Breaking Process>

Following the support plate separating process, the breaking process is performed. The breaking process will be described with reference to FIG. 7 and FIG. 8. In the breaking process, a breaking bar 33 is pressed against the wafer 2 along the scribe lines 4 to cleave the wafer 2 along the scribe lines 4.

FIG. 7 shows a cross section before the breaking bar 33 is pressed against the wafer 2. As shown in FIG. 7, another protective sheet 15 is attached to the surface of the adhesive 11, that is, the surface of the surface layer 11a.

In FIG. 7, the breaking bar 33 pressed against the wafer 2 is illustrated with an imaginary line (i.e., chain double-dashed line). The breaking bar 33 has a length equivalent to the diameter of the wafer 2 and is pressed against the wafer 2 over the entire length of the scribe line 4. The vertical crack 5 has been formed along the scribe line 4 inside the wafer 2. When the breaking bar 33 is strongly pressed against the wafer 2, the vertical crack 5 extends further along the crystal plane and the wafer 2 is thus cleaved along the scribe line 4, as shown in FIG. 8. In FIG. 8, reference number "5a" denotes some traces of the vertical cracks 5.

The breaking bar 33 is pressed against the wafer 2 over the adhesive 11 and the protective sheet 15. When the breaking bar 33 is pressed, the wafer 2 is cleaved, and, at the same time, the adhesive 11 and the protective sheet 15 are also separated along the scribe line 4. FIG. 8 shows a cross section after the braking bar 33 is pressed against the wafer 2 so that the wafer 2 is cleaved along the scribe line 4 and the adhesive 11 and the protective sheet 15 are also separated. The wafer 2 is thus divided into individual semiconductor elements 3a to 3d.

<Removing Process>

Following the breaking process, the removing process is performed. In the removing process, the adhesive 11 is removed from the semiconductor element 3 that has been divided from the wafer 2. FIG. 8 shows the semiconductor element 3c from which the dicing tape 13 has been peeled off, and the adhesive 11 and the protective sheet 15 have been removed. For example, the adhesive 11 is dissolved by a solvent and removed from the semiconductor element 3c. The adhesive 11 and protective sheet 15 are removed also from the other semiconductor elements 3a, 3b and 3d.

According to the manufacturing method of the embodiment described above, the vertical cracks 5 are formed inside the wafer 2 after the adhesive 11 is applied to the wafer 2, and the wafer 2 is divided into individual semiconductor elements 3 before the adhesive 11 is removed from the semiconductor elements 3. Therefore, it is possible to suppress the vertical crack 5 from expanding when the adhesive 11 is removed.

Other features of the manufacturing method of the embodiment are explained as follows. In the support plate separating process, the surface layer 11a of the adhesive 11 is cured to separate the support plate 12 from the adhesive 11. Thus, the support plate 12 can be easily removed. In addition, it is less likely that the breaking bar 33 will be contaminated with the adhesive 11 in the breaking process. That is, at least contamination of the breaking bar 33 with the adhesive 11 is reduced.

In the breaking process, after the protective sheet 15 is attached to the surface of the adhesive 11, the breaking bar 33 is pressed against the wafer 2. As such, the contamination of the breaking bar 33 with the adhesive 11 can be more effectively suppressed by the protective sheet 15.

Note that the protective sheet 15 may be omitted. In such a case, the adhesive 11 may be removed from the wafer 2 using a strong adhesive tape. That is, an adhesive tape may be attached to the surface of the adhesive 11 and the adhesive 11 may be peeled off from the wafer 2 together with the adhesive tape.

Points to note for the technique in the embodiment described above will be described. Neither the scribe wheel 32 nor the breaking bar 33 cuts the wafer 2. The scribe wheel 32 generates the vertical crack 5 inside the wafer 2, and the breaking bar 33 widens the vertical crack 5 to cleave the wafer 2. The scribe wheel 32 and breaking bar 33 may be made of any material and may have any shape as long as the functions described above are achieved.

The vertical crack 5 may reach one of the first surface 2a and the second surface 2b of the wafer 2.

While only the selected exemplary embodiment and examples have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiment and examples according to the present disclosure is provided for illustration only, and not for the purpose of limiting the disclosure as defined by the appended claims and their equivalents.

What is claimed is:

1. A manufacturing method of a semiconductor device, comprising:

preparing a wafer having a first surface, a plurality of semiconductor devices being formed directly on and contacting the first surface, and a support plate being attached to the first surface through an adhesive that contacts the first surface;

grinding a second surface of the wafer opposite to the first surface in a state where the support plate is attached to the first surface of the wafer;

after the grinding the second surface, forming a vertical crack inside the wafer and along a boundary between adjacent semiconductor elements by pressing a scribe wheel directly against the second surface of the wafer along the boundary;

separating the support plate from the wafer while leaving the adhesive on the first surface of the wafer;

cleaving the wafer along the boundary by pressing a breaking bar directly against the first surface of the wafer through the adhesive and along the boundary, thereby dividing the wafer and dividing the plurality of semiconductor devices; and removing the adhesive from at least one of the plurality of semiconductor devices that has been divided from the wafer by the cleaving the wafer, thereby manufacturing the semiconductor device.

2. The manufacturing method according to claim 1, wherein the separating the support plate includes curing a surface layer of the adhesive, and separating the support plate from the adhesive.

3. The manufacturing method according to claim 2, wherein the cleaving the wafer along the boundary includes the pressing the breaking bar directly against the first surface of the wafer, through the adhesive and further through a protective film attached to and contacting the adhesive.

4. The manufacturing method according to claim 3, wherein the pressing the scribe wheel against the second surface occurs in a state where the support plate is attached to the first surface of the wafer through the adhesive.

5. The manufacturing method according to claim 1, wherein the cleaving the wafer along the boundary includes the pressing the breaking bar directly against the first surface of the wafer, through the adhesive, and further through a protective film attached to and contacting the adhesive.

6. The manufacturing method according to claim 5, wherein the pressing the scribe wheel against the second surface occurs in a state where the support plate is attached to the first surface of the wafer through the adhesive.

7. The manufacturing method according to claim 5, wherein in the cleaving the wafer, the breaking bar is pressed against the first surface of the wafer through the adhesive and the protective film in a state where a dicing tape is attached to the second surface, and the breaking bar is pressed so that the adhesive and the protective film are divided along a scribe line at a same time as the cleaving the wafer.

8. The manufacturing method according to claim 1, wherein the pressing the scribe wheel against the second surface occurs in a state where the support plate is attached to the first surface of the wafer through the adhesive.

9. The manufacturing method according to claim 1, wherein the adhesive has a thickness entirely covering the plurality of semiconductor devices on the first surface.

10. The manufacturing method according to claim 1, wherein in the cleaving the wafer, the wafer is divided without dividing a dicing tape attached to the second surface, and the adhesive is removed from the first surface after the wafer is divided and removed from the dicing tape.

11. The manufacturing method according to claim 1, wherein the manufactured semiconductor device has a main component comprising at least one of a gate electrode and a channel, the main component being formed on the first surface.

* * * * *